United States Patent [19]

Barber et al.

[11] Patent Number: 4,696,808
[45] Date of Patent: Sep. 29, 1987

[54] PROCEDURE TO PREPARE TRANSPARENT SILICA GELS

[75] Inventors: Patrick G. Barber, Keysville, Va.; Norman R. Simpson, Rockville, Md.

[73] Assignee: The United States of America as represented by the Administrator of the National Aeronautics and Space Administration, Washington, D.C.

[21] Appl. No.: 933,961

[22] Filed: Nov. 24, 1986

[51] Int. Cl.$^4$ .............................................. C01B 33/12
[52] U.S. Cl. .................................... 423/338; 423/339
[58] Field of Search ................ 423/338, 339; 501/112; 502/233; 106/74

[56] References Cited

U.S. PATENT DOCUMENTS

| | | | |
|---|---|---|---|
| 2,092,163 | 9/1937 | Johnson | 23/132 |
| 2,593,652 | 4/1952 | Blanchard | 23/110 |
| 2,933,371 | 4/1960 | Alexander et al. | 23/110 |
| 3,077,389 | 2/1963 | Schulze et al. | 23/312 |
| 3,397,950 | 8/1968 | Schnorch et al. | 23/110 |
| 3,674,709 | 7/1972 | Barrer et al. | 252/454 |
| 4,528,172 | 7/1985 | Rieck et al. | 423/329 |

OTHER PUBLICATIONS

Chemical Abstracts vol. 105, No. 24, 213052s, Wakabayashi et al., Ion Exchange Equilibria (between Glasses and Molten Salts) and Thermodynamic Properties in Mixed Alkali Glasses.

Chemical Abstracts, vol. 97, No. 16, 132173w, Monseev et al., Ion Exchange in Silicate Glasses.

*Primary Examiner*—John Doll
*Assistant Examiner*—Lori S. Freeman
*Attorney, Agent, or Firm*—George F. Helfrich; John R. Manning

[57] ABSTRACT

A process for the preparation of transparent silica gels which can be used as crystal growth media is disclosed. A quantity of cation exchange resin beads is placed in a solution of a soluble potassium salt and stirred for several hours to allow the potassium ions to replace the cations on the resin beads. The supernatant liquid is then decanted through a filter, and the treated resin beads are rinsed with distilled water to remove excess salts. The treated resin beads are then transferred into a sodium silicate solution. The resulting mixture is stirred to allow the potassium ions on the treated resin beads to exchange with the sodium ions in the sodium silicate solution. The treated silicate solution is then poured through a coarse filter. A volume of boiled, cooled distilled water is added to a volume of the treated silicate solution, after which a volume of acetic acid solution is added to the mixture of distilled water and treated silicate solution. This mixture is then allowed to gel at room temperature, whereby a transparent silica gel is produced. The transparent silica gel is used as a crystal growth medium to simulate the convectionless environment of space and produce structurally perfect crystals.

6 Claims, No Drawings

PROCEDURE TO PREPARE TRANSPARENT SILICA GELS

ORIGIN OF THE INVENTION

The invention described herein was made in the performance of work under NASA Grant No. NAG-1-498 with Longwood College. In accordance with 35 U.S.C. 202, the grantee elected not to retain title.

TECHNICAL FIELD OF THE INVENTION

This invention relates to the production of silica gels and in particular to a process for the preparation of transparent silica gels which can be used as a crystal growth medium that simulates the convectionless environment of space to produce structurally perfect crystals.

BACKGROUND OF THE INVENTION

Modern utilizations of substances in electronics, such as radio transmitters and high frequency microphones, often require single crystals with controlled purity and structural perfection. Previous techniques include growing the crystal from a melt, from a solution, or from a silica gel. However, the methods which require high temperatures, the melt and solution techniques, are likely to produce less perfect crystals, due to the higher frequency of dislocations produced by thermal vibration, the increased solubility of impurities, and the greater number of point imperfections caused by thermal stress during cooling. Accordingly, the use of silica gels as a crystal growth medium has developed into a common method for growing single crystals with structural perfection and controlled purity. The near convectionless environment of silica gel suppresses nucleation, thereby reducing the competitive nature of crystal growth. This competition limits the size and perfection of the crystal: and it is obviously desirable to suppress nucleation until, ideally, only one crystal grows in a predetermined location. However, a silica gel is not a completely convectionless environment like outer space: but it is the closest known environment to that of outer space that can be created on earth.

Alkali metal silicate solutions for the preparation of silica gels are known in the art. In general, a silica gel is prepared by mixing equal volumes of an alkali silica solution, preferably sodium silicate, and a dilute acid and allowing the mixture to gel at a temperature between 20° C. and 45° C. The use of this method produces a cloudy, translucent gel. However, crystals which are grown in gels can be more easily observed if the gel is transparent.

Gels can also be formed by dissolving an aluminum salt in a quantity of acid before mixing with waterglass or sodium metasilicate. The use of this method produces a transparent gel within a few minutes. These gels have complicated ionic adsorption properties, and when crystals are grown in them, there is a tendency for contamination of the crystals with aluminum. For this reason, they are ordinarily not used as a crystal growth medium, despite their otherwise attractive transparency.

Accordingly, it is an object of the present invention to produce silica gels which can be used as a crystal growth medium to simulate the convectionless environment of space.

It is another object of the present invention to produce silica gels which will not contaminate crystals that are grown in the gels.

Another object of the present invention is to produce silica gels which are transparent and allow the observation of crystals grown therein during the growth period.

SUMMARY OF THE INVENTION

According to the present invention, the foregoing and additional objects are achieved by employing the following process:

A quantity of cation exchange resin beads is placed in a solution of a soluble potassium salt, and the resulting mixture is stirred to allow the potassium ions to replace the cations on the resin beads. The supernatant liquid is then decanted through a filter, and the treated resin beads are rinsed with distilled water leaving the cation exchange beads fully charged with potassium ions. A sodium silicate solution is then prepared, into which the treated resin beads are transferred. The resulting mixture is stirred to allow the potassium ions on the treated resin beads to exchange with the sodium ions in the sodium silicate solution. Then the treated solution is poured through a coarse filter. A volume of boiled, cooled distilled water is added to a volume of the treated silicate solution, after which a volume of acetic acid solution is added to the mixture of distilled water and treated silicate solution. This mixture is then allowed to gel at room temperature, whereby a transparent silica gel is produced. The transparent silica gel can be used as a crystal growth medium to simulate the convectionless environment of space and produce structurally perfect crystals.

DETAILED DESCRIPTION OF THE INVENTION

It has been found that the near convectionless environment of silica gels provides a crystal growth medium for growing single crystals with structural perfection and controlled purity. According to the method of this invention, the silica gels are produced by employing an ion exchange method to clarify and improve the transparency of the gel to allow observation of the crystals during growth.

According to one embodiment of the present invention, a quantity of approximately one hundred grams of cation exchange resin beads is placed in a concentrated solution of a soluble potassium salt such as potassium nitrate or potassium chloride. Preferably, the concentration of the solution should be greater than one molar. The mixture is stirred for several hours to allow the potassium ions to replace other cations on the cation exchange resin beads. The resin beads are then separated by decanting the supernatant liquid and rinsed several times with distilled water to remove excess salts and salt solution and allowed to drain on a filter paper.

A sodium silicate solution is then prepared by dissolving 244 grams of sodium silicate in 500 milliliters of distilled or demineralized water. For best results, the solution should have a density of approximately 1.06 $g/cm^3$.

The pretreated resin beads are then transferred to the sodium silicate solution and stirred for several hours. This allows the sodium ions in the sodium silicate solution to exchange with the potassium ions on the resin beads. The supernatant liquid is then decanted through a filter. The success of the above procedure is not dependent upon the amount of resin beads or potassium solution concentration used as long as the amounts are at least as great as the values stated above.

The transparent silica gel is then prepared by first mixing approximately sixteen milliliters of the decanted supernatant with between twenty-five and twenty-nine milliliters of boiled, cooled distilled water. Improved reproducibility is obtained if the solutions are made with boiled and cooled distilled water, and the boiling also removes dissolved gas such as carbon dioxide. Then, a quantity of between twenty-five and twenty-six milliliters of between one molar and four molar acetic acid solution is stirred into the above mixture, which is allowed to gel at room temperature. The resulting gels have greatly improved gel transparency over gels prepared by prior methods.

In using the above method to prepare the silica gel, the use of the smaller volumes, i.e., twenty-five milliliters of distilled water and twenty-five milliliters of acetic acid solution, results in firm gels. Conversely, the use of the larger volumes, i.e., twenty-nine milliliters of distilled water and twenty-six milliliters of acetic acid solution, results in much softer gels. The firmness of the gel will also vary depending on the atmosphere in the laboratory. Furthermore, the use of the more concentrated acetic acid solution causes the silica gels to set faster than do the weaker concentrations. It is desirable for the gels to be firm enough to maintain their integrity, while at the same time, soft enough to allow crystal growth to occur unperturbed.

In order that the invention may be better understood, reference should be made to the following illustrative examples:

EXAMPLE I

In one example of the present method using the described embodiment, a stock solution of silica gel was prepared by dissolving 48.8 grams of sodium silicate in 100ml of boiled, de-ionized water. The gel was treated with cation exchange beads to exchange sodium for potassium ions. A quantity of sixteen milliliters of the clarified stock solution was poured into twenty-six milliliters of boiled, distilled water. After thoroughly mixing this solution, twenty-six milliliters of 4.0 molar acetic acid solution was added with stirring. This clear, colorless solution was then immediately poured into a glass tube which has a 24/40 standard taper, ground glass joint at each end. The glass tube had been pre-prepared by placing a clean cork in one end and by holding the glass tube in an upright position with a metal clamp. Within two hours the gels had solidified into a clear, colorless plug at the lower end of the glass tube. The cork was removed, and the ground glass joints were lubricated with silicon grease. The glass tube was then held horizontally and a 250 ml round bottom glass flask was placed on each end. The round bottom flasks have a 5 mm glass tube protruding upward through which the crystallizing solutions were poured. Into the bulb on the left end, which is the end away from the gel plug, 200 ml of a solution that was 0.01 molar in lead acetate and 0.001 molar in ethylenediaminetetraacetic acid (EDTA) were added. This bulb is filled first so that the gel plug remains firmly wedged against the taper of the ground glass joint. Then into the round bulb on the right side, which is adjacent to the gel plug, 200 ml of a solution of 0.01 molar thioacetamide were added. Within twenty-four hours dark Liesagang rings of lead sulfide crystals formed in the gel. The rings of crystals were tilted at a small angle to the plane face of the gel.

EXAMPLE II

In a second example of the present method, the same silica stock solution and gel preparation procedures described in Example I above were used to prepare another clear, colorless plug of silica gel at one end of the glass tube which has two standard taper 24/40 joints. Into the bulb on the left of this tube were placed 200 ml of a solution of 0.001 molar iodine and 0.02 molar potassium iodide. Into the bulb on the right, which is adjacent to the gel plug, was placed 200 ml of a solution of 0.01 molar mercury (II) acetate. Within twelve hours small crystals of reddish mercury (II) iodide formed in the gel.

EXAMPLE III

In a third example of the present method, the same silica stock solution and gel preparation procedures described in Example I above were used to prepare another clear, colorless plug of silica gel at one end of the glass tube which has two standard taper 24/40 joints. Before assembling the double-bulb apparatus, a very thin glass fiber that had been freshly pulled from a Pasteur pipette was used to poke three very thin diameter holes half-way into the gel from the end adjacent to the ground glass joint. The purpose of this procedure was to prepare sites favorable for the formation of crystal nuclei and thus encourage the formation of larger crystals in the gel. Into the round bottom glass flask on the left, which is the side furtherest away from the gel plug, 200 ml of a solution of 0.01 molar lead acetate and 0.01 molar ethylenediaminetetraacetic acid (EDTA) were added. Into the round bottom glass flask on the right, which is the side adjacent to the gel plug and the side from which the holes were poked, 200 ml of a solution of 0.01 molar thioacetamide were added. Larger black crystals formed in the gel at the thioacetamide side of the plug, i.e., the right side. The usual heavy black rings of small crystals and nuclei also formed in the gel.

EXAMPLE IV

In a fourth example of the present method, the procedure of Example III was repeated using 200 ml of a solution that had lead acetate and EDTA in the left round bottom flask. In the right round bottom flask, which was adjacent to the clear, colorless gel plug that had been poked with a glass fiber, 200 ml of thioacetamide were added. A series of nine experiments were performed with only the concentrations of the solutions changed. The concentrations of the solutions used are summarized in the following table:

| Run Number | Concentration/Molar |
| --- | --- |
| 1 | 0.01 |
| 2 | 0.02 |
| 3 | 0.03 |
| 4 | 0.04 |
| 5 | 0.05 |
| 6 | 0.06 |
| 7 | 0.07 |
| 8 | 0.08 |
| 9 | 0.09 |

The purpose of this series of experimental runs was to determine the effect of changing concentrations on the crystals formed in the gel. In solutions #1 and #2, a few white crystals were formed and the gel acquires a milkish color. In solution #3, some crystal nucleation occurred with the formation of black and grey bands of very small crystals in the gel. In solution #4, black crystals formed in horizontal bands on the lower surface of the gel plug in the glass tube. The color lightens to grey toward the middle of the gel and remains clear in the top half. In solution #5, long dendrites of opaque white crystals formed in the gel along with the usual black bands of small crystals. In solutions #6 and #7, the gel plugs broke free of the glass taper and allowed the solutions to mix, so no crystals formed in the gels. In solution #8, massive quantities of small black crystals formed in the gel while white, dendritic crystals developed in the solutions just adjacent to the gels. In solution #9, some of the white dendritic crystals formed adjacent to the gel, which was totally blackened by small crystals.

While the present invention has been described with reference to particular embodiments thereof, it will be understood, of course, that certain changes, modifications, and substitutions will be apparent to those skilled in the art without departing from the spirit and scope of the claims.

What is claimed as new and desired to be secured by Letters Patent of the United States is:

1. A process for the preparation of a transparent silica gel which is useful as a crystal growth medium which comprises the sequential steps of:

obtaining a quantity of cation exchange resin beads;
   mixing said cation exchange resin beads with a concentrated solution of a soluble potassium salt;
   stirring the mixture of cation exchange resin beads and soluble potassium salt solution for a period of time to allow the potassium ions to replace the cations on the resin beads;
   decanting the supernatant liquid from the mixture of the previous step through a filter and rinsing the treated resin beads with distilled water;
   preparing a sodium silicate solution;
   transferring said treated resin beads to said sodium silicate solution and stirring the mixture for a period of time to allow the sodium ions in the solution to exchange with the potassium ions on the beads;
   pouring the treated silicate solution through a filter;
   adding a volume of boiled, cooled distilled water to a volume of said treated silicate solution and then adding a volume of acetic acid solution to the mixture of distilled water and treated silicate solution;
   allowing the mixture of the previous step to remain at room temperature;
   whereby a transparent silica gel is produced.

2. The process of claim 1 wherein the soluble potassium salt is potassium nitrate.

3. The process of claim 1 wherein the soluble potassium salt is potassium chloride.

4. The process of claim 1 wherein the concentration of the soluble potassium salt solution is greater than one molar.

5. The process of claim 1 wherein the sodium silicate solution has a density of approximately 1.06 g/cm$^3$.

6. The process of claim 1 wherein the final step employs between twenty-five and twenty-nine milliliters of distilled water, approximately sixteen milliliters of treated silicate solution, and between twenty-five and twenty-six milliliters of between one molar and four molar acetic acid solution.

* * * * *